United States Patent
Bergkvist, Jr. et al.

(10) Patent No.: US 8,234,104 B2
(45) Date of Patent: Jul. 31, 2012

(54) SIMULATION OF DIGITAL CIRCUITS

(75) Inventors: John Joseph Bergkvist, Jr., Williston, VT (US); Serafino Bueti, Waterbury, VT (US); Francis A. Kampf, Jeffersonville, VT (US); Douglas Thomas Massey, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1141 days.

(21) Appl. No.: 12/103,770

(22) Filed: Apr. 16, 2008

(65) Prior Publication Data

US 2009/0265154 A1 Oct. 22, 2009

(51) Int. Cl.
*G06F 17/50* (2006.01)
(52) U.S. Cl. .......................................................... 703/16
(58) Field of Classification Search ...................... 703/16
See application file for complete search history.

(56) References Cited

U.S. PATENT DOCUMENTS

| | | |
|---|---|---|
| 5,958,077 A | 9/1999 | Banerjee et al. |
| 6,353,906 B1 | 3/2002 | Smith et al. |
| 6,598,191 B1 | 7/2003 | Sharma et al. |
| 2004/0230414 A1 | 11/2004 | Hoppe et al. |
| 2005/0216247 A1 | 9/2005 | Ikeda et al. |
| 2006/0090149 A1 | 4/2006 | Blanco et al. |

OTHER PUBLICATIONS

Motika et al.; A logic chip delay-test method based on system timing; IBM J. Res. Develop. vol. 34 No. 2/3 Mar./May 1990; pp. 299-313.*

\* cited by examiner

*Primary Examiner* — Hugh Jones
(74) *Attorney, Agent, or Firm* — Schmeiser, Olsen & Watts; David Cain

(57) ABSTRACT

A method for simulating a circuit. The method includes, in response to a first mode change triggering event at a first time point and in response to a first data transfer triggering event at a second time point after the first time point, generating a random value of at least a first random value and a second random value. In response to the generated random value being the first random value, a first input value of an input of the circuit is assigned to an output of the circuit. In response to the generated random value being the second random value, an output value of the output of the circuit is maintained. In response to a second data transfer triggering event at a third time point after the second time point, a second input value of the input of the circuit is assigned to the output of the circuit.

20 Claims, 4 Drawing Sheets

SIMULATION OF DIGITAL CIRCUITS

FIELD OF THE INVENTION

The present invention relates generally to digital circuits and more particularly to simulation of digital circuits.

BACKGROUND OF THE INVENTION

In an integrated circuit having multiple registers, a change in a mode/gating signal may arrive at the registers at different times. As a result, at a first rising edge of the clock, these registers may behave differently. Therefore, there is a need for a simulation method that simulates the difference in the behaviours of the registers of the integrated circuit.

SUMMARY OF THE INVENTION

The present invention provides a method for simulating a circuit, comprising in response to a first mode change triggering event at a first time point and in response to a first data transfer triggering event at a second time point after the first time point, generating a random value selected from the group consisting of a first random value and a second random value; in response to the generated random value being the first random value, assigning a first input value of an input variable to an output variable, wherein the input variable simulates an input of the circuit, and wherein the output variable simulates an output of the circuit; in response to the generated random value being the second random value, maintaining an output value of the output variable; and in response to a second data transfer triggering event at a third time point after the second time point, assigning a second input value of the input variable to the output variable.

The present invention provides a simulation method that simulates the difference in the behaviour of the registers of the integrated circuit.

DETAILED DESCRIPTION OF THE INVENTION

Figure 1:
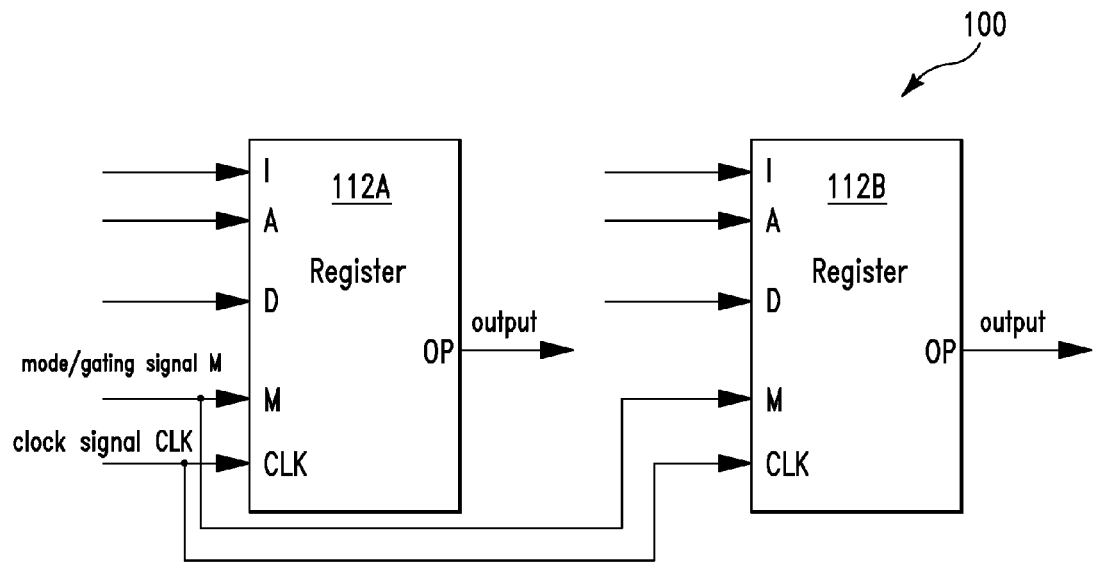
FIG. 1 shows a block diagram of a circuit, in accordance with embodiments of the present invention.

FIG. 1 shows a block diagram of a circuit 100, in accordance with embodiments of the present invention. More specifically, with reference to FIG. 1, the circuit 100 comprises registers 112A and 112B. The register 112A comprises inputs I, A, D, M, and CLK and an output OP. The inputs I and A of the register 112A receive testing signals during testing. The input D of the register 112A is configured to receive data signal. The inputs M and CLK of the register 112A receive mode/gating signal M and clock signal CLK, respectively.

In one embodiment, the register 112A operates in two modes: test mode and functional mode. Whether the register 112A is in the test mode or the functional mode depends on the mode/gating signal M at the input M of the register 112A. More specifically, illustratively, if the mode/gating signal M rises, then the register 112A enters the functional mode, whereas if the mode/gating signal M falls, then the register 112A exits the functional mode and enters the test mode.

In one embodiment, in the test mode, the inputs I and A of the register 112A receive testing signals for testing. The method for testing the register 112A is well known in the art. During the test mode, the clock signal CLK is gated off by the mode/gating signal M and has no effect on the testing operation of the register 112A. At a rising edge of the mode/gating signal M, the register 112A is switched from the test mode to the functional mode. In the functional mode, at a rising edge of the clock signal CLK, the output OP receives and maintains the value of the input D (OP=D) until the next rising edge of the clock signal CLK. In one embodiment, the structure and operation of the register 112B are similar to the structure and operation of the register 112A.

Assume that the registers 112A and 112B are situated in the chip (not shown) such that the inputs CLK of the registers 112A and 112B receive a change in the clock signal CLK at essentially the same time. Assume further that the inputs M of the registers 112A and 112B receive a change in the mode/gating signal M at different times.

Assume initially that the registers 112A and 112B are in the test mode. Assume further that, as an example, at a time t1, a change in the mode/gating signal M from low to high (i.e., a rising edge of the mode/gating signal M) arrives at the input M of the register 112A but has not yet arrived at the input M of the register 112B. As a result, the register 112A switches from the test mode to the functional mode, whereas the register 112B remains in the test mode.

Assume further that, at a time t2 after time t1, a change in the clock signal CLK from low to high (i.e., a first rising edge of the clock signal CLK) arrives at the inputs CLK of the register 112A and 112B. As a result, for the register 112A, the output OP receives and maintains the value of the input D, whereas for the register 112B, the output OP remains electrically disconnected from the input D and maintains whatever value it currently has.

Assume further that, at a time t3 after time t2, the rising edge of the mode/gating signal M arrives at the input M of the register 112B. As a result, the register 112B switches from the test mode to the functional mode. Assume further that, at a time t4 after the time t3, a next rising edge (second rising edge) of the clock signal CLK arrives at the inputs CLK of the registers 112A and 112B. As a result, for both the registers 112A and 112B, the outputs OP receive and maintain the value of the respective inputs D.

In the embodiments described above, only two registers 112A and 112B receive the mode/gating signal M and the clock signal CLK. In general, N registers (similar to the registers 112A and 112B) can receive the mode/gating signal M and the clock signal CLK (N is a positive integer). As described above, it is likely that, at the time of the first rising edge of the clock signal CLK after a rising edge of the mode/gating signal M (like the time t2 in the example above), for some of the N registers, outputs OP receive and maintain the values of the respective inputs D, whereas for the other registers of the N registers, outputs OP remain electrically disconnected from the respective inputs D and maintain whatever value they currently have (at the time t2). Later, at the time the second rising edge of the clock signal CLK arrives at the N registers (like the time t4 in the example above), for all of the N registers, outputs OP receive and maintain the values of the respective inputs D.

In summary, for each register of the N registers, at the time the first rising edge of the clock signal CLK arrives at the register after a rising edge of the mode/gating signal M, the output OP either (i) receives and maintains the value of the input D or (ii) is electrically disconnected from the input D and maintains whatever value it currently has. Later, at the time the second rising edge of the clock signal CLK arrives at the register, the output OP receives and maintains the value of the input D.

Figure 2A:
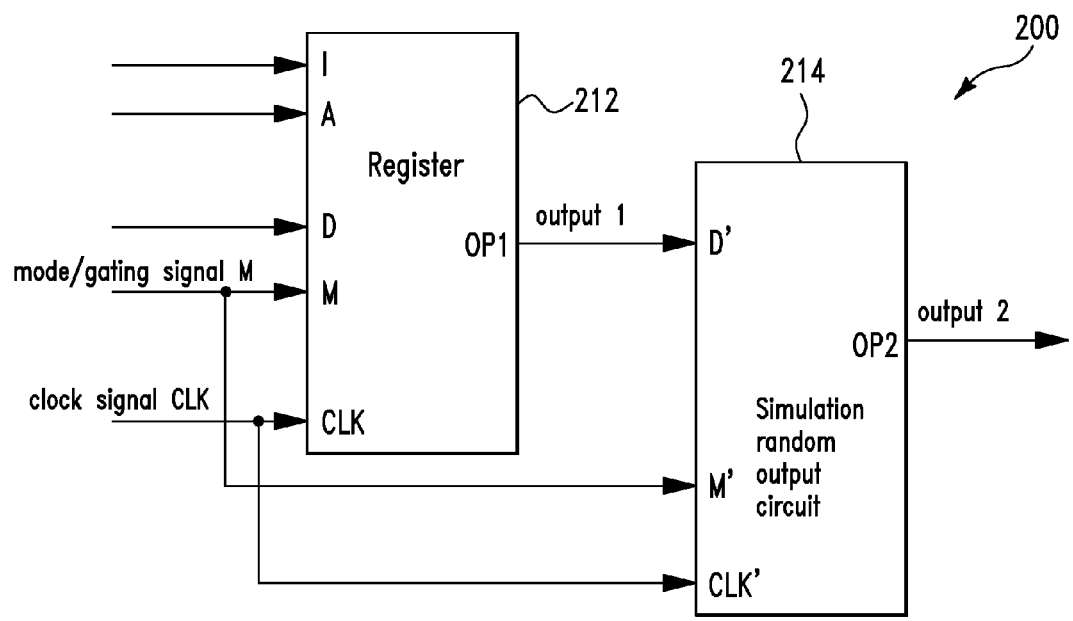
FIG. 2A shows a block diagram of a simulation circuit that simulates a register of FIG. 1, in accordance with embodiments of the present invention.

FIG. 2A shows a block diagram of a simulation circuit 200 that simulates the register 112A of FIG. 1, in accordance with embodiments of the present invention. A simulation circuit is a circuit as described in a simulation program written in a simulation software language such as Verilog or HDL, etc. In other words, a simulation circuit is a representative of a block of codes/instructions that simulates the circuit. More specifically, with reference to FIG. 2A, the simulation circuit 200 comprises a simulation register 212 and a simulation random output circuit 214 electrically coupled to the simulation register 212.

In one embodiment, the simulation register 212 is similar to the register 112A of FIG. 1. The simulation random output circuit 214 comprises three inputs D', M', and CLK' and an output OP2. The input D' is electrically connected to the output OP1 of the simulation register 212. This connection of the input D' and the output OP1 can be simulated by the assignment D'=OP1 in the simulation program. A simulation program comprises statements written in a simulation software language. The inputs M' and CLK' receive the mode/gating signal M and the clock signal CLK, respectively.

Figure 2B:
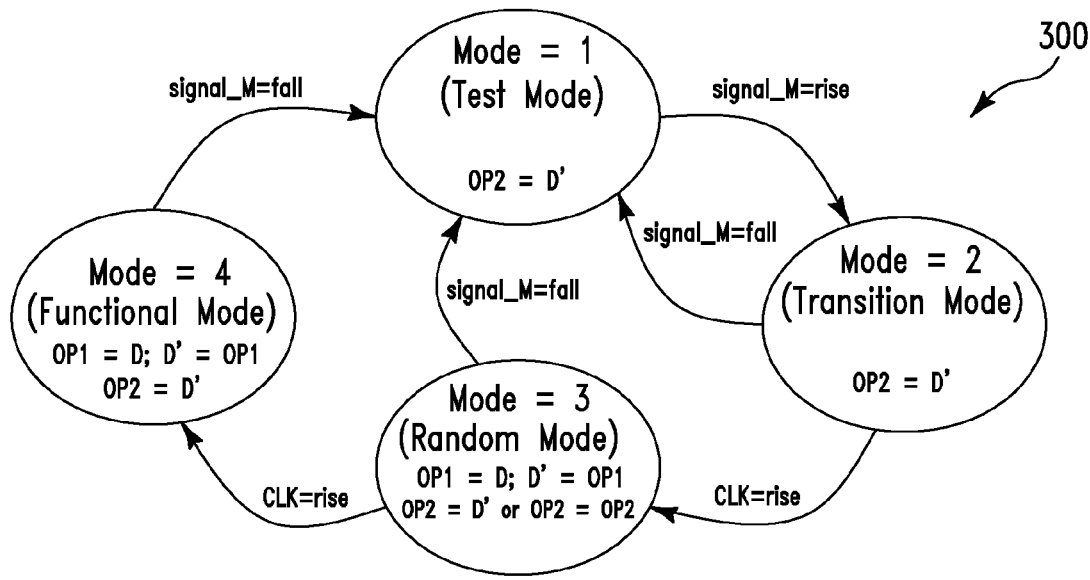
FIG. 2B shows a flowchart that illustrates the operation of the simulation circuit of FIG. 2A during simulation, in accordance with embodiments of the present invention.

FIG. 2B shows a flowchart 300 that illustrates the operation of the simulation circuit 200 during simulation, in accordance with embodiments of the present invention. In other words, the flowchart 300 of FIG. 2B illustrates the flow of the simulation program represented by the simulation circuit 200 of FIG. 2A. More specifically, with reference to FIGS. 2A and 2B, let Mode be a variable of the simulation program that indicates the mode of the simulation circuit 200. Let values 1, 2, 3, and 4 of the variable Mode indicate that the simulation circuit 200 is in a test mode, a transition mode, a random mode, and a functional mode, respectively.

Let signal_M be a variable of the simulation program that simulates the mode/gating signal M. Let CLK be a variable of the simulation program that simulates the clock signal CLK.

Assume initially that the simulation circuit 200 is in the test mode (simulating the register 112A of FIG. 1 being in the test mode). In the test mode, Mode=1 (simulating that the simulation register 212 is in its own test mode). Also, OP2=D'. The variable D' simulates the input D'. Similarly, the variable OP2 simulates the output OP2.

Then, assume that signal_M=rise (simulating the rising edge of mode/gating signal M of FIG. 1 at time t1 in the example described above), which can be referred to as a first mode change triggering event. As a result, the assignment Mode=2 is performed (simulating that the simulation circuit 200 enters the transition mode). Also, the continuous assignment OP2=D' is performed (i.e., the value of variable D' is assigned to the variable OP2).

Then, assume that CLK=rise (simulating the first rising edge of clock signal CLK of FIG. 1 at time t2 in the example described above). In response, the assignment Mode=3 is performed simulating that the simulation circuit 200 enters the random mode. Also, according to the function of circuit 212, the assignment of OP1=D is performed on the rising event of CLK. Subsequently, the input to circuit 214 D' is evaluated to be the value of OP1 based upon the connections of circuit 200. In the random mode, a random number (0 or 1) is randomly generated and assigned to a variable RN. If RN=0, then the a continuous assignment OP2=OP2 is performed (i.e., OP2 maintains whatever value it currently has). Otherwise, if RN=1, then the assignment OP2=D' is performed resulting in OP2=D.

Then, assume that CLK=rise (simulating the second rising edge of clock signal CLK of FIG. 1 at time t4 in the example described above). In response, the assignment Mode=4 is performed simulating that the simulation circuit 200 enters the functional mode. Also, according to the function of circuit 212, the assignment of OP1=D is performed on the rising event of CLK. Subsequently, the input to circuit 214 D' is evaluated to be the value of OP 1 based upon the connections of circuit 200. A continuous assignment OP2=D' is performed resulting in the output OP2 obtaining the value of D.

If the simulation circuit 200 is in the transition mode, the random mode, or the functional mode (i.e., Mode=2, 3, or 4) and if the signal_M=fall (which can be referred to as a second mode change triggering event), then the assignment Mode=1 is performed simulating that the simulation circuit 200 enters the test mode. Also, the continuous assignment OP2=D' is performed.

In summary, after signal_M=rise (simulating the rising edge of mode/gating signal M of FIG. 1 at time t1 in the example described above) and at the first CLK=rise (simulating the first rising edge of clock signal CLK of FIG. 1 at time t2 in the example described above), depending on the random number RN=1 or 0, either the output OP2=D (simulating the output OP of the register 112A of FIG. 1 receiving and maintaining the value of its input D) or the output OP2 is unchanged (simulating the output OP of the register 112A of FIG. 1 electrically disconnected from its input D). Then, at the second CLK=rise (simulating the second rising edge of clock signal CLK of FIG. 1 at time t4 in the example described above), the output OP2=D (simulating the output OP of the register 112A of FIG. 1 receiving and maintaining the value of its input D). Also, at signal_M=fall, the simulation circuit 200 is switched to the test mode (simulating the register 112A of FIG. 1 entering the test mode). Therefore, the simulation circuit 200 accurately simulates the operation of the register 112A of FIG. 1. In one embodiment, the simulation circuit 200 and the flowchart 300 are also used to simulate the operation of the register 112B of FIG. 1.

It should be noted that the simulation circuit 212 alone does not accurately simulate the operation of the register 112A of FIG. 1. More specifically, at the first CLK=rise (simulating the first rising edge of clock signal CLK of FIG. 1 at time t2 in the example described above), assignment OP1=D is performed (because the simulation circuit 212 is in its own functional mode) simulating that OP=D for the register 112A of FIG. 1. In contrast, in reality, as shown in the example described above, at time t2, the output OP of the register 112A either (i) receives and maintains the value of its input D (i.e., OP=D) or (ii) is electrically disconnected from its input D (i.e., OP may be different than D).

In the embodiments described above, each of the registers 112A and 112B of FIG. 1 has only one mode/gating input (the input M) receiving one mode/gating signal (the mode/gating signal M). In other words, the first and second mode change triggering events (i.e., a rising edge and a falling edge of the mode/gating signal M, respectively) are created by the mode/gating signal M. Alternatively, each of the registers 112A and 112B of FIG. 1 can have more than one mode/gating input each of which receives one mode/gating signal. In other words, mode change triggering events are created by the mode/gating signals.

Figure 3:
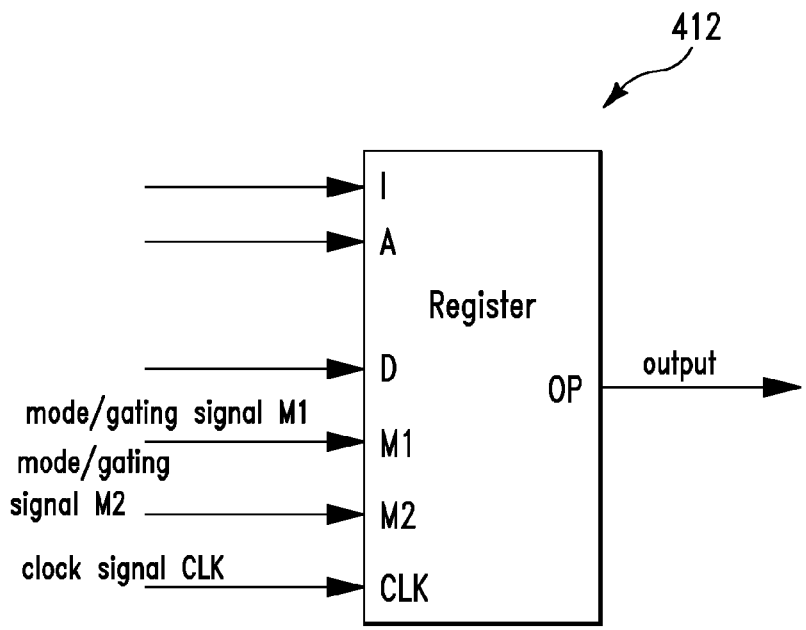
FIG. 3 shows a register that has two mode/gating inputs receiving two respective mode/gating signals.
Figure 4:
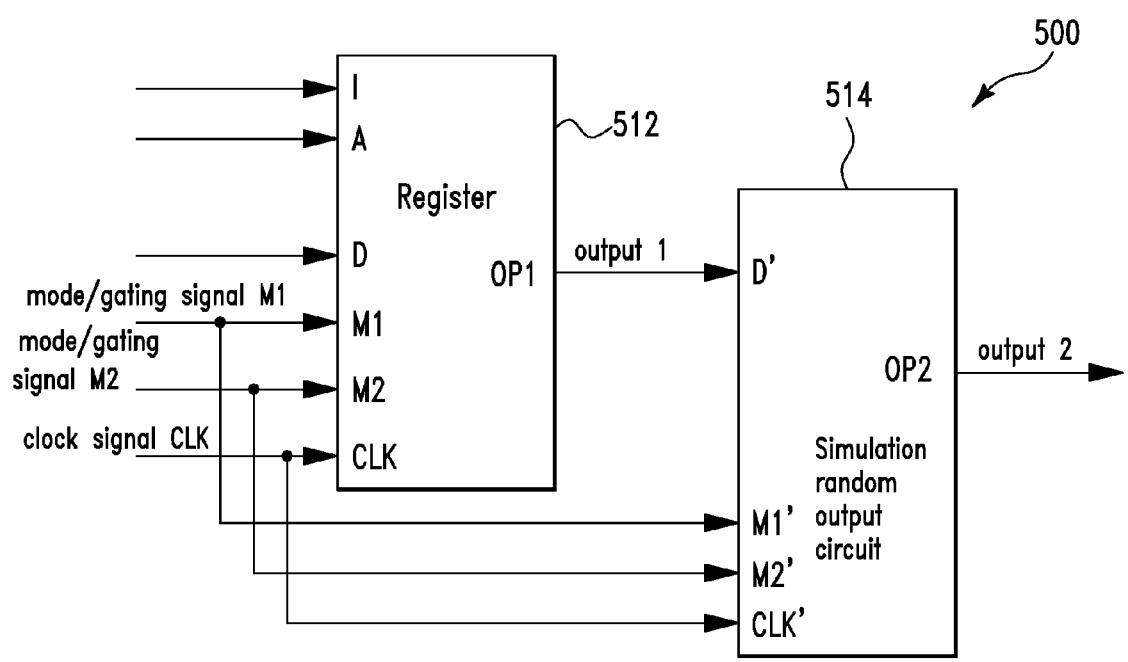
FIG. 4 shows a block diagram of another simulation circuit that simulates the register of FIG. 3.

FIG. 3 shows a register 412 that has two mode/gating inputs M1 and M2 receiving mode/gating signals M1 and M2, respectively. FIG. 4 shows a block diagram of a simulation circuit 500 that simulates the register 412 of FIG. 3. The operation flow of the simulation circuit 500 is similar to the operation flow of the simulation circuit 200 of FIG. 2A during simulation.

Figure 5:
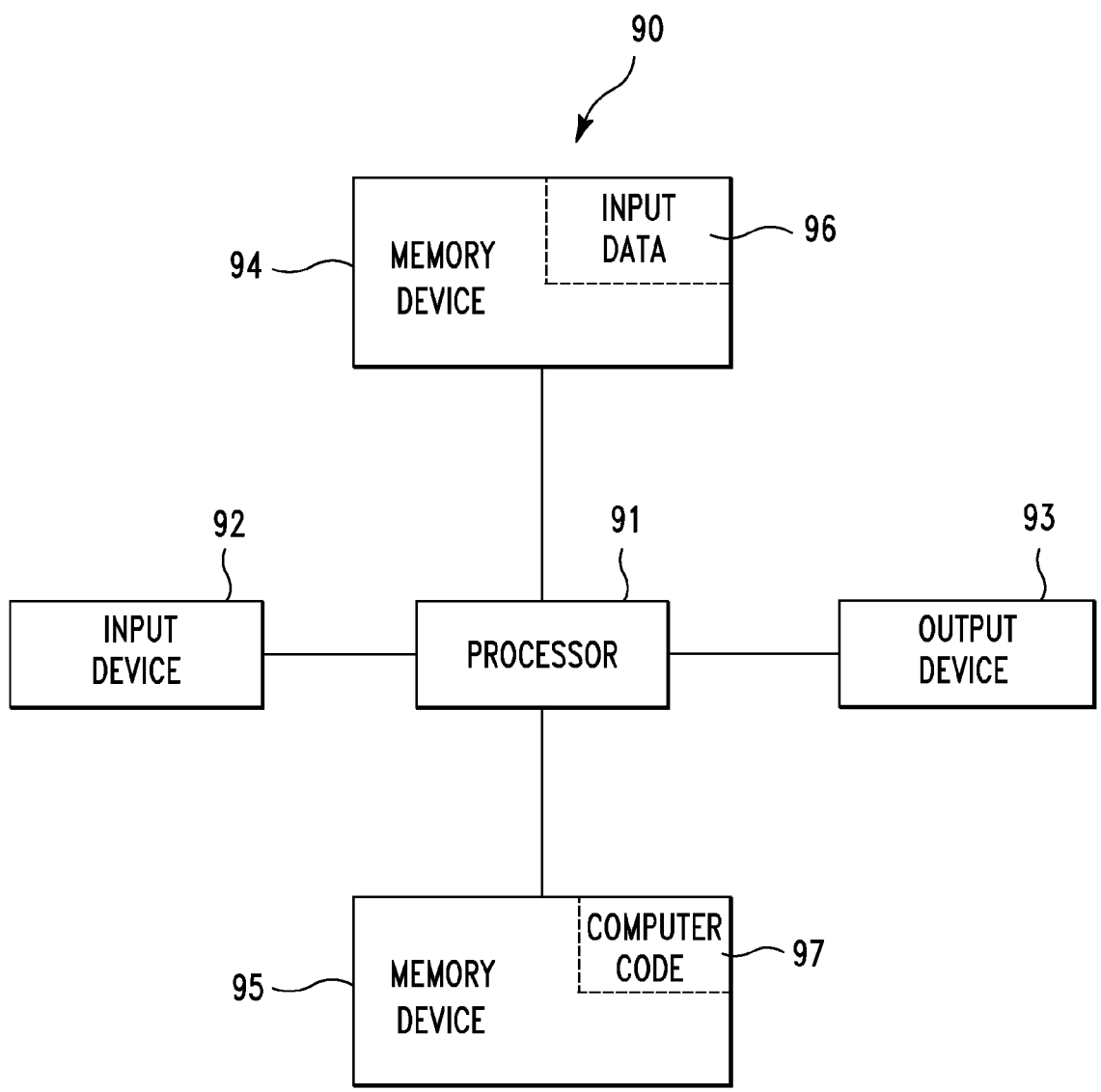
FIG. 5 illustrates a computer system used for simulating the register of FIG. 1, in accordance with embodiments of the present invention.

FIG. 5 illustrates a computer system 90 used for simulating the register 112A of FIG. 1, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, etc. The output device 93 may be, inter alia, a printer, a plotter, a computer screen, a magnetic tape, a removable hard disk, a floppy disk, etc. The memory devices 94 and 95 may be, inter alia, a hard disk, a floppy disk, a magnetic tape, an optical storage such as a compact disc (CD) or a digital video disc (DVD), a dynamic random access memory (DRAM), a read-only memory (ROM), etc. The memory device 95 includes a computer code 97. The computer code 97 includes an algorithm for simulating the register 112A of FIG. 1. The processor 91 executes the computer code 97. The memory device 94 includes input data 96. The input data 96 includes input required by the computer code 97. The output device 93 displays output from the computer code 97. Either or both memory devices 94 and 95 (or one or more additional memory devices not shown in FIG. 5) may be used as a computer usable medium (or a computer readable medium or a program storage device) having a computer readable program code embodied therein and/or having other data stored therein, wherein the computer readable program code comprises the computer code 97. Generally, a computer program product (or, alternatively, an article of manufacture) of the computer system 90 may comprise said computer usable medium (or said program storage device).

While FIG. 5 shows the computer system 90 as a particular configuration of hardware and software, any configuration of hardware and software, as would be known to a person of ordinary skill in the art, may be utilized for the purposes stated supra in conjunction with the particular computer system 90 of FIG. 5. For example, the memory devices 94 and 95 may be portions of a single memory device rather than separate memory devices.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for simulating a circuit, comprising:
in response to a first mode change triggering event at a first time point and in response to a first data transfer triggering event at a second time point after the first time point, a processor of a computer system generating a random value selected from the group consisting of a first random value and a second random value;
in response to the generated random value being the first random value, said processor assigning a first input value of an input variable to an output variable, wherein the input variable simulates an input of the circuit, and wherein the output variable simulates an output of the circuit;
in response to the generated random value being the second random value, said processor maintaining an output value of the output variable; and
in response to a second data transfer triggering event at a third time point after the second time point, said processor assigning a second input value of the input variable to the output variable.

2. The method of claim 1, wherein the first mode change triggering event is created as a result of a change of a first mode/gating variable, wherein the first mode/gating variable simulates a first mode/gating signal of the circuit.

3. The method of claim 2, wherein the first mode change triggering event is created also as a result of a change of a second mode/gating variable, wherein the second mode/gating variable simulates a second mode/gating signal of the circuit.

4. The method of claim 2, wherein the first mode change triggering event comprises a rising edge of the mode/gating variable.

5. The method of claim 1, wherein the first mode change triggering event triggers a change in a mode variable, wherein the mode variable simulates a mode of the circuit, and wherein said change in the mode variable simulates a mode change from a test mode of the circuit to a functional mode of the circuit.

6. The method of claim 5, further comprising, in response to a second mode change triggering event at a fourth time point after the first time point, said processor assigning a first mode value to the mode variable simulating that the circuit is in a test mode.

7. The method of claim 6, further comprising, in response to the first mode change triggering event at the first time point and in response to the mode variable containing the first mode value, said processor assigning a second mode value to the mode variable simulating that the circuit is in a transition mode.

8. The method of claim 7, further comprising, in response to the first data transfer triggering event at the second time point after the first time point and in response to the mode variable containing the second mode value, said processor assigning a third mode value to the mode variable simulating that the circuit is in a random mode.

9. The method of claim 8, further comprising, in response to the second data transfer triggering event at the third time point after the first time point and in response to the mode variable containing the third mode value, said processor assigning a fourth mode value to the mode variable simulating that the circuit is in a functional mode.

10. The method of claim 1, wherein the first data transfer triggering event comprises a first rising edge of a clock variable, wherein the clock variable simulates a clock signal applied to the circuit, and wherein the second data transfer triggering event comprises a second rising edge of the clock variable.

11. The method of claim 10, wherein the second rising edge of the clock variable is immediately after the first rising edge of the clock variable such that there is no rising edge of the clock variable between the first and second rising edges of the clock variable.

12. The method of claim 1, wherein the circuit comprises a register.

13. A computer system comprising a processor and a computer readable memory unit coupled to the processor, said memory unit containing instructions that when executed by the processor implement a method for simulating a circuit, said method comprising the computer implemented steps of:

in response to a first mode change triggering event at a first time point and in response to a first data transfer triggering event at a second time point after the first time point, generating a random value selected from the group consisting of a first random value and a second random value;

in response to the generated random value being the first random value, assigning a first input value of an input variable to an output variable, wherein the input variable simulates an input of the circuit, and wherein the output variable simulates an output of the circuit;

in response to the generated random value being the second random value, maintaining an output value of the output variable; and in response to a second data transfer triggering event at a third time point after the second time point, assigning a second input value of the input variable to the output variable.

14. The computer system of claim 13, wherein the first mode change triggering event is created by at least one mode/gating signal.

15. The computer system of claim 14, wherein the first mode change triggering event is created by at least two mode/gating signals.

16. The computer system of claim 14, wherein the first mode change triggering event comprises a rising edge of a first mode/gating signal of the at least two mode/gating signals.

17. The computer system of claim 13, wherein said method further comprises the step of:

in response to a second mode change triggering event at a fourth time point after the first time point, assigning a first mode value to a variable Mode indicating that the circuit is in a test mode.

18. The computer system of claim 17, wherein said generating the random value comprises, in response to the first mode change triggering event at the first time point, assigning a second mode value to the variable Mode indicating that the circuit is in a transition mode.

19. The computer system of claim 18, wherein said generating the random value further comprises, in response to the first data transfer triggering event at the second time point after the first time point, assigning a third mode value to the variable Mode indicating that the circuit is in a random mode.

20. The computer system of claim 19, wherein said assigning the second input value of the input of the circuit comprises assigning a fourth mode value to the variable Mode indicating that the circuit is in a functional mode.

* * * * *